United States Patent
Kim et al.

(10) Patent No.: US 10,326,068 B2
(45) Date of Patent: Jun. 18, 2019

(54) THERMOELECTRIC DEVICE, THERMOELECTRIC MODULE INCLUDING THE THERMOELECTRIC DEVICE, THERMOELECTRIC APPARATUS INCLUDING THE THERMOELECTRIC MODULE, AND METHOD OF MANUFACTURING THE SAME

(71) Applicant: Samsung Electronics Co., Ltd., Suwon-si, Gyeonggi-do (KR)

(72) Inventors: Sang-il Kim, Seoul (KR); Sung-woo Hwang, Yongin-si (KR); Sang-mock Lee, Yongin-si (KR); Kyu-hyoung Lee, Hwaseong-si (KR); Vilius Mykhailovsky, Chernovtsy (UA); Roman Mochernyuk, Chernovtsy (UA)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 654 days.

(21) Appl. No.: 14/048,236

(22) Filed: Oct. 8, 2013

(65) Prior Publication Data

US 2014/0096809 A1    Apr. 10, 2014

(30) Foreign Application Priority Data

Oct. 8, 2012   (KR) .................. 10-2012-0111417

(51) Int. Cl.
  *H01L 35/12*  (2006.01)
  *H01L 35/18*  (2006.01)
  (Continued)

(52) U.S. Cl.
  CPC .............. *H01L 35/26* (2013.01); *H01L 35/16* (2013.01); *H01L 35/34* (2013.01)

(58) Field of Classification Search
  CPC .......... H01L 35/26; H01L 35/16; H01L 35/34
  See application file for complete search history.

(56) References Cited

U.S. PATENT DOCUMENTS 6,083,770 A    7/2000    Sato et al.
6,172,294 B1   1/2001    Tsuno et al.
(Continued)

FOREIGN PATENT DOCUMENTS

JP    2011510500 A    3/2011
KR   19990067520 A    8/1999
(Continued)

OTHER PUBLICATIONS

Rhyee et al., "Peierls distortion as a route to high thermoelectric performance in In4Se3-d crystals", Nature, vol. 459, Jun. 18, 2009, pp. 965-968.

(Continued)

*Primary Examiner* — Susan D Leong
(74) *Attorney, Agent, or Firm* — Cantor Colburn LLP

(57) ABSTRACT

A thermoelectric device including: a thermoelectric material layer comprising a thermoelectric material; a transition layer on the thermoelectric material; and a diffusion prevention layer on the transition layer, wherein the thermoelectric material comprises a compound of Formula 1:

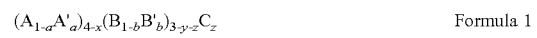

$(A_{1-a}A'_a)_{4-x}(B_{1-b}B'_b)_{3-y-z}C_z$    Formula 1 wherein A and A' are different from each other, A is a Group 13 element, and A' is at least one element of a Group 13 element, a Group 14 element, a rare-earth element, or a transition metal, B and B' are different from each other, B is a Group 16 element, and B' is at least one element of a Group 14 element, a Group 15 element, or a Group 16 element, C is at least one halogen atom, a complies with the inequality $0 \le a < 1$, b complies with the inequality $0 \le b < 1$, x complies (Continued)

with the inequality $-1<x<1$, y complies with the inequality $-1<y<1$, and z complies with $0 \leq z < 0.5$.

10 Claims, 8 Drawing Sheets

(51) Int. Cl.
  *H01L 35/34* (2006.01)
  *H01L 35/26* (2006.01)
  *H01L 35/16* (2006.01)

(56) References Cited

U.S. PATENT DOCUMENTS

| | | | |
|---|---|---|---|
| 7,851,910 B2 | 12/2010 | Riedl | |
| 9,065,014 B2 | 6/2015 | Kim et al. | |
| 2005/0110157 A1* | 5/2005 | Sherrer | G02B 6/4201 |
| | | | 257/776 |
| 2005/0241690 A1* | 11/2005 | Tajima | H01L 35/08 |
| | | | 136/212 |
| 2010/0051080 A1* | 3/2010 | Rhyee | C01B 19/002 |
| | | | 136/239 |
| 2010/0294326 A1* | 11/2010 | Guo | B22F 3/14 |
| | | | 136/238 |
| 2011/0023930 A1 | 2/2011 | Konig et al. | |
| 2011/0240083 A1 | 10/2011 | Rhyee et al. | |
| 2012/0055526 A1 | 3/2012 | Rhyee et al. | |
| 2014/0216515 A1* | 8/2014 | Ochi | H01L 35/10 |
| | | | 136/205 |

FOREIGN PATENT DOCUMENTS

| | | |
|---|---|---|
| KR | 1020120019701 A | 3/2012 |
| KR | 1020120057448 A | 6/2012 |
| KR | 1020120068386 A | 6/2012 |
| WO | 2009092421 A3 | 7/2009 |

OTHER PUBLICATIONS

Office Action issued by the Korean Patent Office dated Feb. 21, 2019 in the examination of the Korean Patent Application No. 10-2012-0111417, which corresponds to the U.S. Appl. No. 14/048,236.

* cited by examiner

THERMOELECTRIC DEVICE, THERMOELECTRIC MODULE INCLUDING THE THERMOELECTRIC DEVICE, THERMOELECTRIC APPARATUS INCLUDING THE THERMOELECTRIC MODULE, AND METHOD OF MANUFACTURING THE SAME

CROSS-REFERENCE TO RELATED APPLICATIONS

This application claims priority to and the benefit of Korean Patent Application No. 10-2012-0111417, filed on Oct. 8, 2012, and all the benefits accruing therefrom under 35 U.S.C. § 119, the content of which is incorporated herein in its entirety by reference.

BACKGROUND

1. Field

The present disclosure relates to a thermoelectric device, a thermoelectric module including the device, a thermoelectric apparatus including the thermoelectric module, and methods of manufacturing the same, and more particularly, to a thermoelectric module having improved thermal and mechanical stability.

2. Description of the Related Art

A thermoelectric phenomenon is a reversible, direct energy conversion from heat to electricity and vice versa. The thermoelectric phenomenon refers to a phenomenon in which a phonon transfers when electrons and holes move in a thermoelectric material, or a phenomenon in which electrons or holes move due to heat transfer to provide an electrical current. The thermoelectric phenomenon includes the Peltier effect and the Seebeck effect. The Peltier effect can be used in a cooling system, which operates based on a temperature difference at opposite ends of a material due to a current applied thereto from the outside, and the Seebeck effect can be used to provide a power-generation system, which operates based on an electromotive force generated by a temperature difference at opposite ends of a material. These effects are reversible phenomena.

A thermoelectric device that induces the thermoelectric phenomenon may be used to provide a thermoelectric module, e.g., a Peltier device, to provide a thermoelectric cooler. The thermoelectric device can absorb heat from a low-temperature heat source and transfer the heat to a high-temperature heat source, and also can generate power due to a temperature difference between opposite ends of a thermoelectric material. Accordingly, the thermoelectric device is getting attention as a new regeneration energy source. A thermoelectric power generation material is applicable to a part dissipating heat in engines of vehicles and industrial plants.

There remains a need for materials for thermoelectric modules which provide improved thermal and mechanical stability.

SUMMARY

Provided is a thermoelectric module in which interfacial characteristics between a thermoelectric device and an electrode are improved by inclusion of a composite coating layer comprising a transition layer and a diffusion prevention layer.

Provided are methods of manufacturing a thermoelectric device including a composite coating layer.

Additional aspects will be set forth in part in the description which follows and, in part, will be apparent from the description.

According to an aspect, provided is a thermoelectric device including: a thermoelectric material layer including a thermoelectric material; a transition layer on the thermoelectric material; and a diffusion prevention layer on the transition layer, wherein the thermoelectric material includes the compound of Formula 1 below:

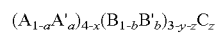  Formula 1 wherein
 A and A' are different from each other, A is a Group 13 element, and A' is at least one element a Group 13 element, a Group 14 element, a rare-earth element, or a transition metal,
 B and B' are different from each other, B is a Group 16 element, and B' is at least one element a Group 14 element, a Group 15 element, or a Group 16 element,
 C is at least one halogen atom,
 a complies with the inequality $0 \le a < 1$,
 b complies with the inequality $0 \le b < 1$,
 x complies with the inequality $-1 < x < 1$,
 y complies with the inequality $-1 < y < 1$, and
 z complies with the inequality $0 \le z < 0.5$.

According to an embodiment, the transition layer may include at least one of Co, Sn, CoTe, $CoTe_2$, or SnTe.

According to an embodiment, the transition layer may include a combination including at least one of Co, Sn, CoTe, $CoTe_2$, or SnTe, and a compound represented by Formula 1.

According to an embodiment, the transition layer may include a combination including at least one of Co, Sn, CoTe, $CoTe_2$, or SnTe and an $In_4Se_{3-x}$ based material wherein $0<x<0.5$, e.g., the compound of Formula 1.

According to another aspect, a thermoelectric module includes a p-type thermoelectric device and an n-type thermoelectric device; and top and bottom electrodes to which the p-type thermoelectric device and the n-type thermoelectric device are attached so that the p-type thermoelectric device and the n-type thermoelectric device are alternately arranged,
 wherein each of the n-type thermoelectric device and the p-type thermoelectric device include a thermoelectric material layer comprising a thermoelectric material, the a transition layer, and a diffusion prevention layer,
 wherein the thermoelectric material includes a compound of Formula 1:

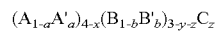  Formula 1 wherein
 A and A' are different from each other, A is a Group 13 element, and A' is at least one element a Group 13 element, a Group 14 element, a rare-earth element, or a transition metal,
 B and B' are different from each other, B is a Group 16 element, and B' is at least one element of a Group 14 element, a Group 15 element, or a Group 16 element,
 C is at least one halogen atom,
 a complies with the inequality $0 \le a < 1$,
 b complies with the inequality $0 \le b < 1$,
 x complies with the inequality $-1 < x < 1$,
 y complies with the inequality $-1 < y < 1$, and
 z complies with the inequality $0 \le z < 0.5$.

Also disclosed is a thermoelectric apparatus including the thermoelectric module.

According to another aspect, provided is a method of manufacturing a thermoelectric device, wherein the method includes:

disposing a top portion of a diffusion prevention layer powder, a top portion of a transition layer powder, a thermoelectric material powder, a bottom portion of the transition layer powder, and bottom portion of the diffusion prevention layer powder sequentially and in the foregoing order in a mold;

compression-molding to form a powder body;

vacuum hot-pressing the powder body by heating and compressing the powder body in a vacuum to form a compression-molded body; and rapidly cooling the compression-molded body to manufacture the thermoelectric device, wherein the thermoelectric device comprises a diffusion prevention layer integrally attached to top and bottom portions of the thermoelectric device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
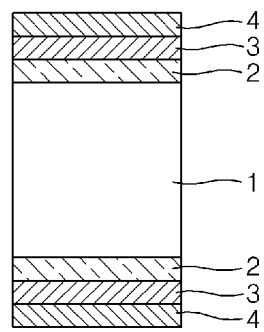
FIG. 1 is a schematic diagram of an embodiment of a thermoelectric device with a composite coating layer attached thereto.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A thermoelectric module can include an insulating substrate, N-type and P-type thermoelectric devices, and a metal electrode. Also, to maintain suitable thermoelectric characteristics of the thermoelectric module, a diffusion prevention layer may be included between a thermoelectric material and an electrode of a thermoelectric module. The thermoelectric unit includes a pair of N-type and P-type thermoelectric semiconductor devices as a unit, and the thermoelectric module includes one or more thermoelectric units.

The thermoelectric module may undergo mechanical degradation due to thermal stress resulting from a temperature difference between opposite ends of the module during operation, which can be at least several hundred degrees Celsius. Since this mechanical degradation occurs where the most susceptible part of the thermoelectric module is present, that is, at the interface of a thermoelectric material and a diffusion prevention layer, or at the interface of a diffusion prevention layer and a metal electrode, it would be desirable to provide improved thermal and mechanical stability to the contact structure for the interface between the diffusion prevention layer and the electrode.

An example of a recently developed thermoelectric material composition is an $In_4Se_{3-x}$ (0<x<0.5)-based material. The $In_4Se_{3-x}$ (0<x<0.5)-based material has very low thermal conductivity and a high Seebeck coefficient, and thus, is getting attention for use as a material for moderate-temperature power generation (see, for example, Nature 459, 965, 2009, the content of which is incorporated herein by reference in its entirety), and recently, studies therefor are actively performed, and when the material is used in a module, the formed module is applicable for thermoelectric power generation. $In_4Se_{3-x}$ is used as an n-type material, and known examples of a p-type material are p-type PbTe, $CoSb_3$, $Zn_4Se_3$, and $Mg_2Si$. To manufacture a new material-applied module, a coating material suitable for an $In_4Se_{3-x}$-based material is desired. Accordingly, it would be desirable to provide a coating material that has low interfacial resistance and improved thermal/mechanical stability.

"Rare earth" means the fifteen lanthanide elements, i.e., atomic numbers 57 to 71, plus scandium and yttrium.

The "lanthanide elements" means the chemical elements with atomic numbers 57 to 71.

"Transition metal" as defined herein refers to an element of Groups 3 to 12 of the Periodic Table of the Elements.

According to an aspect, a transition layer and a diffusion prevention layer are disposed as a composite coating layer between a thermoelectric material and an electrode of a thermoelectric module to improve thermal stability and mechanical stability.

A thermoelectric module may undergo mechanical degradation due to thermal stress resulting from a temperature difference between opposite ends of the module during operation, and this mechanical degradation may occur at an interface of a thermoelectric material and a diffusion prevention layer, or an interface of the diffusion prevention layer and a metal electrode. For example, when a thermoelectric device is manufactured by using a thermoelectric material with a relatively high thermal expansion coefficient, a greater thermal stress may occur due to the difference in temperature between opposite ends of a module, thereby leading to a substantial decrease in thermal stability. Accordingly, by disposing a transition layer as an intermediate coating layer between the thermoelectric device and the diffusion prevention layer, the mechanical degradation due to thermal stress may be suppressed and thus, thermal and mechanical stability may improve.

Figure 3:
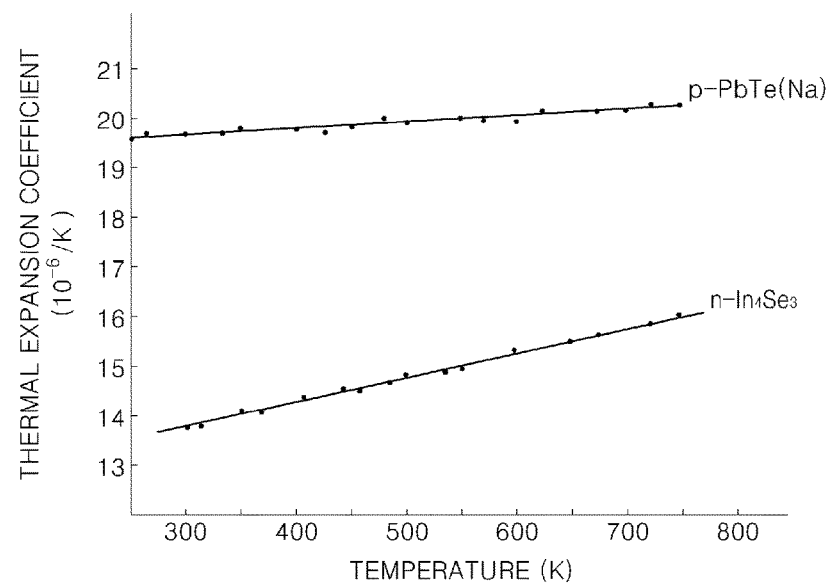
FIG. 3 is a graph of thermal expansion coefficient (per $10^{-6}$ Kelvin) versus temperature (Kelvin, K) showing the thermal expansion rate of $In_4Se_3$.
Figure 4:
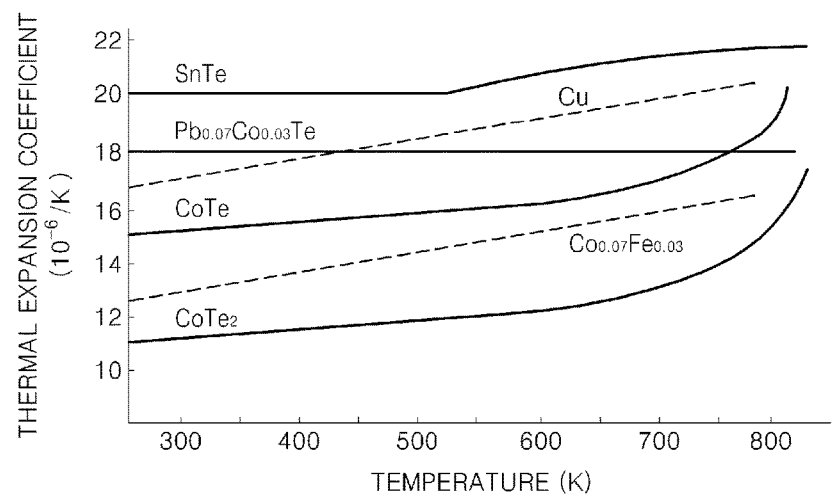
FIG. 4 is a graph of thermal expansion coefficient (per $10^{-6}$ Kelvin) versus temperature (Kelvin, K) which shows a temperature-dependency of some metallic components according to a thermal expansion coefficient.

For example, in the case of $In_4Se_3$, a thermal expansion rate thereof is a relatively high and thus, has a temperature-dependency. Referring to FIG. 3, at a temperature of about 300 K to about 750 K, the thermal expansion coefficient changes from about $13.8 \times 10^{-6}$/K to about $16 \times 10^{-6}$/K (a 16% expansion). The respective coating layers may be formed of materials having similar thermal expansion characteristics to each other to decrease thermal impact that repeatedly occur due to a difference in thermal expansion coefficients of an electrode and a thermoelectric material, and as shown in FIG. 4, $In_4Se_3$ has a pattern that is similar to that of CoTe or $CoTe_2$. Accordingly, as a material for a transition layer, for example, CoTe and $CoTe_2$ may be used, and to maximize a decrease in thermal impact, for example, $In_4Se_3$ and $CoTe/CoTe_2$ are appropriately combined, and the combination may be applied to maximize stability.

According to an embodiment, the transition layer may include two or more atoms of a transition metal, a Group 13 element, a Group 14 element, a Group 15 element, or a Group 16 element. The transition metal may be at least one of Ti, Zr, Hf, V, Nb, Ta, Cr, Mo, W, Mn, Fe, Co, Ni, Cu, Zn, Ag, or Re, the Group 13 element may be at least one of B, Al, Ga, or In, the Group 14 element may be at least one of C, Si, Ge, Sn, or Pb, the Group 15 element may be at least one of P, As, Sb, or Bi, and the Group 16 element may be at least one of S, Se, or Te. From among these, a CoTe-based alloy or a SnTe-based alloy may be used, and examples of the CoTe-based alloy are CoTe and $CoTe_2$, and an example of the SnTe-based alloy is SnTe.

According to an embodiment, the transition layer may be used in a mixed form, and may include, for example, in addition to those components, a component that is used in the thermoelectric material layer, for example, the compound of Formula 1. For example, when the diffusion prevention layer includes CoTe and the thermoelectric material includes $In_4Se_3$, which has a relatively high thermal expansion coefficient, the transition layer may comprise a combination of CoTe and $In_4Se_3$. As is further described above, when the transition layer is used in a mixed form, mechanical damage that may occur due to the difference between the thermal expansion coefficients of the thermoelectric material of the thermoelectric material layer and the diffusion prevention layer may be further reduced. A component of the thermoelectric material layer that may be included in the transition layer may be any suitable material as long as constituting elements of the component of the thermoelectric material layer are the same as in the transition layer, and the chemical composition, for example, a composition ratio of the constituting elements of the component of the thermoelectric material layer may be the same as that of the transition layer.

According to an embodiment, when the transition layer includes a mixture of two different components including a compound of the thermoelectric material layer, a weight ratio of the respective components may be in a range of 1:9 to 9:1.

The transition layer may have a thickness of about 20 micrometers (μm) to about 1000 μm, or about 100 μm to about 500 μm, but the thickness thereof is not limited thereto.

According to an embodiment, to reduce thermal impact that repeatedly occurs due to the difference between the thermal expansion coefficients of an electrode and a thermoelectric material, the transition layer may include a material that has a thermal expansion coefficient in a range that is similar to that of the thermoelectric material.

A diffusion prevention layer may be formed on the transition layer, and the diffusion prevention layer may prevent diffusion of a component of the electrode toward the thermoelectric device. The diffusion prevention layer may include any suitable metal in consideration of contact efficiency with respect to the electrode, and may include, for example Ti, Pt, Pd, Ti, W, Ni, Si, Ta, TiW, TiN, WN, TaN, or TiWN, or a silicide of Ti, Pt, Pd, Ti, W, Ni, or Ta.

The diffusion prevention layer may have a thickness of about 10 μm to about 500 μm, or about 20 μm to about 200 μm, but the thickness thereof is not limited thereto.

According to an embodiment, the thermoelectric device may additionally include a contact layer between the diffusion prevention layer and the electrode.

While not wanting to be bound by theory, it is understood that a major reason for low efficiency of the thermoelectric module is a low performance of the thermoelectric device. However, an interfacial resistance between the thermoelectric device and the electrode may also contribute to a decrease in efficiency of the thermoelectric module. Actually, when a thermoelectric power-generation module operates, efficiency thereof may be 30% or more less than a power generation efficiency calculated on the basis of theory, due to the interfacial resistance. The interfacial resistance may occur mainly due to high interfacial resistance between the thermoelectric device and the diffusion prevention layer, and between the diffusion prevention layer and the electrode, and dry joint, such as pores or cracks caused by contact non-uniformity of the respective layers. Accordingly, due to the inclusion of the contact layer between the diffusion prevention layer and the electrode, the interfacial resistance between the diffusion prevention layer and the electrode and the interfacial adhesive force may improve, thereby leading to a low interfacial resistance and a high mechanical strength.

The contact layer may include, for example Fe, Ag, Ni, Co, steel, Mo, or Cr, and a thickness thereof may be in a range of about 10 μm to about 1000 μm, or about 50 μm to about 200 μm, but is not limited thereto.

According to an embodiment, the composite coating layer of the thermoelectric device may have a structure comprising a transition layer and a diffusion prevention layer, or a structure comprising a transition layer, a diffusion prevention layer, and a contact layer.

A thermoelectric device including the composite coating layer may include a thermoelectric material layer comprising a thermoelectric material; a transition layer on the thermoelectric material; and a diffusion prevention layer on the transition layer.

The thermoelectric material may comprise the compound of Formula 1:

$$(A_{1-a}A'_a)_{4-x}(B_{1-b}B'_b)_{3-y-z}C_z \qquad \text{Formula 1}$$

wherein
A and A' are different from each other, A is a Group 13 element, and A' is at least one element of a Group 13 element, a Group 14 element, a rare-earth element, or a transition metal,
B and B' are different from each other, B is a Group 16 element, and B' is at least one element of a Group 14 element, a Group 15 element, or a Group 16 element,
C is at least one halogen atom,
a complies with the condition of $0 \le a < 1$,
b complies with the condition of $0 \le b < 1$,
x complies with the condition of $-1 < x < 1$,
y complies with the condition of $-1 < y < 1$, and
z complies with the condition of $0 \le z < 0.5$.

The compound of Formula 1, A indicates at least one of Group 13 elements, and B indicates at least one selected from chalcogen elements (a Group 16 element). In the compound of Formula 1, A' and B' respectively indicate elements to be doped on Component A and Component B.

A Group 13 element that constitutes Component A may be Ga or In.

Component A', which is a substituent element which may be doped or substituted for component A, may be optionally added to optimize the current density of a thermoelectric material. Component A' may be at least one of a Group 13 element, a Group 14 element, a rare-earth element, and a transition metal and may be different from Compound A. For use as Compound A', examples of the Group 13 element are Ga and In, examples of the Group 14 element are Si, Ge, Sn, and Pb, and an example of the rare-earth element is a lanthanum group element.

In the compound of Formula 1, a molar ratio (a) of the substituent element A' may comply with the condition of $0 \le a < 1$, for example $0 \le a \le 0.5$, or $0 \le a \le 0.2$.

In the compound of Formula 1, a molar ratio (4-x) of $A_{1-a}A'_a$ may comply with the condition of $-1 < x < 1$, for example, $0 \le x \le 0.5$, or $0 \le a \le 0.2$.

For use as Component B, which is a major element of the thermoelectric material, the chalcogen element may be at least one of S, Se, or Te.

Component B', which is a substituent element to be doped on Compound B, may be optionally added to optimize the current density of a thermoelectric material. Component B' may be at least one of a Group 14 element, a Group 15 element, or a Group 16 element, and may be different from Compound B. For use as Compound B', examples of the Group 14 element are Si, Ge, Sn, or Pb, examples of the Group 15 element are P, Sb, or Bi, and examples of the Group 16 element are S, Se, or Te.

In the compound of Formula 1, a molar ratio (b) of Component B' may comply with the condition of $0 \le b < 1$, for example, $0 \le b \le 0.5$ or $0 \le a \le 0.2$.

In the compound of Formula 1, z of a molar ratio (3-y-z) of $B_{1-b}B'_b$ indicates a doping molar ratio of a halogen element, and y may comply with the condition of $-1 < y < 1$, for example, $0 \le y \le 0.5$ or $0 \le a \le 0.2$.

Component A' and Component B', which are doping components, may be added in the form of a one-component system, a two-component system, or a three-component system, and in the case of a two-component system, a molar ratio thereof may be in a range of 1:9 to 9:1, and in the case of a three-component system, a molar ratio thereof may be in a range of 1:0.1-0.9:0.1-0.9, but the molar ratios are not limited thereto.

In the compound of Formula 1, a molar ratio of Component $A_{1-a}A'_a$ to Component $B_{1-b}B'_b$ may be in 4:2.5 to 2.9.

In the compound of Formula 1, C is a halogen element to be doped on an AB-based material, and may be F, Cl, Br, I, or a combination thereof. An amount thereof may be, for example, no greater than a defect of Component $B_{1-b}B'_b$.

In the compound of Formula 1, a molar ratio (z) of C may comply with the condition of $0 \leq z < 0.5$, and may be, for example, $0 \leq z < 0.2$, $0 \leq z \leq 0.1$, or $0 \leq z \leq 0.05$.

The compound of Formula 1 may be used in an n-type thermoelectric device, and may be, for example, an $In_4Se_{3-x}$-based material.

FIG. 1 illustrates a thermoelectric device including a composite coating layer according to an embodiment. As illustrated in FIG. 1, a transition layer 2, a diffusion prevention layer 3, and optionally a contact layer 4 are sequentially formed in this stated order on each of top and bottom portions of a thermoelectric material layer 1 to form a composite coating layer on the thermoelectric material layer 1.

Figure 2:
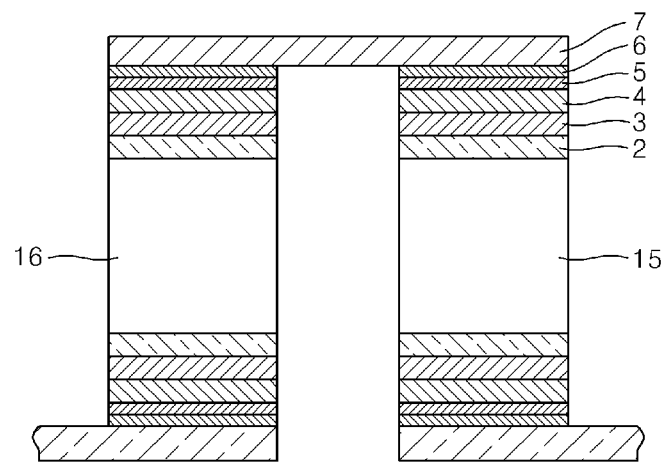
FIG. 2 is a cross-sectional view of an embodiment of a thermoelectric module.

Thermoelectric devices may be alternately arranged on electrodes, and an example of such a structure is illustrated in FIG. 2. In FIG. 2, a thermoelectric device with the composite coating layers 2, 3, and 4 attached thereto, is attached to an electrode 6 through an adhesive layer 5, and the electrode 6 is disposed on the substrate 7.

From among composite coating layers disposed on the thermoelectric material layer, when a diffusion prevention layer or a contact layer contacts an electrode, an adhesive agent may be used. For use as the adhesive agent, a material that has excellent adhesive characteristics in addition to heat resistance/electric resistance may be used. For example, the adhesive agent may be a solder, or silver paste, but is not limited thereto. The adhesive agent may be any of various materials that allow the composite coating layers to be attached to an electrode and have high electric conductivities. When such materials are used, the adhesive layer may provide sufficient adhesive properties between the electrode and the coating layer.

From among composite coating layers disposed on the thermoelectric material layer, when a diffusion prevention layer or a contact layer contacts an electrode, diffusion welding may be used. This method is to apply a pressure to a thermoelectric device that forms a composite interface with an electrode to perform the attachment by diffusion at high temperature. A transition layer and a diffusion prevention layer used for the thermoelectric device are the same as described above.

An electrode for use in the thermoelectric module may be formed of a material that has high electric conductivity to minimize loss in power supplied to a thermoelectric module. For example, the material for the electrode may be a highly conductive material including at least one of copper (Cu), copper-molybdenum (Cu—Mo), silver (Ag), gold (Au), or platinum (Pt). Also, Fe, Ag, Ni, Co, Steel, Mo, or Cr may be used to form the electrode.

An n-type thermoelectric device 16 may be a thermoelectric device with the composite coating layers 2, 3, and 4 attached thereto as illustrated in FIG. 1.

A p-type thermoelectric device 15 may be formed of an Mg—Si based thermoelectric semiconductor, a Co—Sb based thermoelectric semiconductor, a Pb—Te based thermoelectric semiconductor, or a Zn—Se based thermoelectric semiconductor. For example, when $In_4Se_3$ is used for an n-type thermoelectric device, PbTe, $CoSb_3$, $Zn_4Se_3$, or $Mg_2Si$ may be used for a p-type thermoelectric device.

Figure 5:
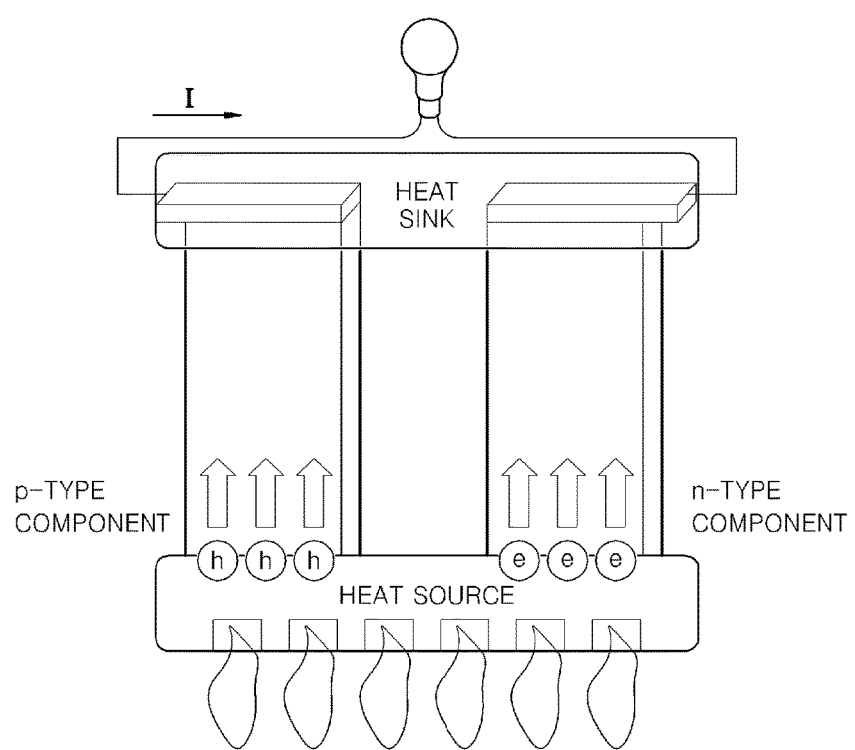
FIG. 5 is a schematic view of an embodiment of a power generation process of a thermoelectric module.

FIG. 5 illustrates a process in which electric energy is generated from a heat source. Due to heat of the heat source, in a p-type thermoelectric device, holes move, and in an n-type thermoelectric device, electrons move, and thus, ultimately, electric energy is generated from heat energy.

The thermoelectric module as described above may be used in various thermoelectric power-generation apparatuses. When heat energy is supplied by using a heat source, electric energy may be generated. Accordingly, the thermoelectric module may be suitable for use in, for example, waste-heat power generation or thermoelectric nuclear power-generation for military and aerospace purposes.

A thermoelectric material layer with the composite coating layer attached thereto may be manufactured by using the following method.

To form the respective coating layers by coating, a plurality of deposition processes may be performed. Coating of the respective coating layers may be by one-stage vacuum hot pressing. By doing so, the manufacturing process may be simplified.

According to a method which is used for manufacturing a module of a $Bi_2Te_3$-based material, after a device is formed, a vacuum deposition process including depositing a diffusion prevention layer and depositing a Sn layer is performed and then, a contact layer (Au, Bi—Sn, Sn, and Cu) may be formed. In the case of a current process, in general, 10 or more processes are used and thus, the manufacturing process is complicated, and during soldering, high-temperature attachment is difficult to achieve. In particular, in the case of a high-temperature material, soldering is performed in a range of about 600 to about 700° C. and thus, oxidation-associated problems may become serious, thereby leading to an increase in a contact resistance.

One-stage vacuum hot pressing may be performed such that powders that constitute the respective coating layers are sequentially provided into a mold and then vacuum hot pressing is performed thereon. By doing so, for example, when a thermoelectric device is manufactured using a $In_4Se_{3-x}$ material (0<x<0.5), a diffusion prevention layer and a transition layer may be formed by one-stage vacuum hot pressing, and a plurality of processes such as those used in the current method may be reduced to one-stage. This process is applicable to, in addition to $In_4Se_{3-x}$ (0<x<0.5), other materials.

When composite coating layers are formed by vacuum hot pressing, at interfacial surfaces, the respective powders may be slightly mixed and thus, the interfacial resistance may be low. Also, the respective coating layers are appropriately attached to each other, leading to high mechanical strength and heat impact stability. The vacuum hot pressing is, unlike a conventional vacuum deposition process, simple, and even when a high-temperature material is used, oxidation-associated problems may be prevented and a contact resistance may decrease.

In an embodiment, a method of manufacturing a thermoelectric device comprises: disposing a top portion of a diffusion prevention layer powder, a top portion of a transition layer powder, a thermoelectric material powder, a bottom portion of the transition layer powder, and bottom portion of the diffusion prevention layer powder sequentially and in the foregoing order in a mold; compression-molding to form a powder body; vacuum hot-pressing the powder body by heating and compressing the powder body in a vacuum to form a compression-molded body; and rapidly cooling the compression-molded body to manufacture the thermoelectric device, wherein the thermoelectric device comprises a diffusion prevention layer integrally attached to top and bottom portions of the thermoelectric device.

For example, a thermoelectric device to which a diffusion prevention layer and a transition layer are integrally attached to upper and lower portions thereof by vacuum hot pressing may be formed as follows:

A graphite or carbon mold may be filled with a top portion of a diffusion prevention layer powder, a top portion of a transition layer powder, a powder for a thermoelectric material, bottom portion of the transition layer powder, and bottom portion of the diffusion prevention layer powder, and then, the result is compression-molded to form top and bottom diffusion prevention layer bodies, top and bottom transition layer powder bodies, and a powder body for a thermoelectric material layer. Then, the mold with these bodies is located in a vacuum hot pressing apparatus chamber, and subsequently, in a vacuum atmosphere, the chamber is heated and compressed and then, the temperature and the pressure are maintained to compression-mold the powder bodies, and then, the compression-molded diffusion prevention layer powder bodies, the transition layer powder bodies, and the powder body for the thermoelectric material layer are rapidly cooled, thereby completing manufacture of a thermoelectric device to which a diffusion prevention layer is integrally attached to each of top and bottom portions thereof. The portions, e.g., the top portions and the bottom portions, may be suitable amounts of the diffusion layer powder, the transition layer powder, and the powder of the thermoelectric material to provide the diffusion layers, the transition layers, and the thermoelectric material layer. The composition of the diffusion layer powder may be the same as the diffusion layer, and the composition of the transition layer powder may be the same as the transition layer.

The heating and compressing of the powder bodies may be performed at, for example, about 300° C. to about 600° C., or about 400° C. to about 55° C., and about 50 mega-Pascals (MPa) to about 90 MPa, or about 55 MPa to about 80 MPa. The heating and compressing may be performed for about 1 minute to about 1 hour, or about 5 minutes to about 30 minutes.

The vacuum atmosphere may be about $1\times10^{-2}$ atmosphere (atm) to about $5\times10^{-3}$ atm.

The forming of the contact layer on the diffusion prevention layer may be performed by electroplating or thermal spraying, and any known method may be used herein without any limitation.

As another method, first, a thermoelectric device may be manufactured by plasma sintering, and then, a transition layer and a diffusion prevention layer may be sequentially formed thereon and heated while compressing to attach to the thermoelectric device. Also, the transition layer and the diffusion prevention layer may each be formed by thermal spraying.

According to an embodiment, the compression-molding may be performed while the heating temperature and the pressure for the compression are maintained for a predetermined period of time. Also, the rapid cooling may be performed by cooling to room temperature.

As described above, a thermoelectric module is manufactured by using a thermoelectric device and composite coating layers. Regarding a thermoelectric device to which an electrode for a thermoelectric device and at least one of a transition layer and a diffusion prevention layer are integrally attached, the sintering for the attachment may be performed at a temperature of about 450° C. to about 700° C., or about 500° C. to about 600° C. for about 3 minutes to about 10 minutes.

The thermoelectric module manufactured as described above may be used in various thermoelectric apparatuses.

Hereinafter, examples are described in detail, but the examples are provided herein for illustrative purpose only and the present invention is not limited thereto.

EXAMPLES

Example 1

A carbon mold was filled with the following components sequentially, and then, the result was compression-molded to form top and bottom diffusion prevention layer powder bodies, top and bottom transition layer powder bodies, top and bottom contact layer powder bodies, and powder body for a thermoelectric material layer.

top contact layer: Fe: 0.05 g
top diffusion prevention layer: SnTe: 0.05 g
top transition layer: SnTe+In$_4$Se$_3$ (weight ratio=50:50): 0.05 g
thermoelectric material layer: In$_4$Se$_3$: 0.93 g
bottom transition layer: SnTe+In$_4$Se$_3$ (weight ratio=50:50): 0.05 g
bottom diffusion prevention layer SnTe: 0.05 g
bottom contact layer: Fe: 0.05 g The mold containing these components was located in a vacuum hot pressing apparatus chamber, and then, air was discharged therefrom for 10 minutes to form a vacuum atmosphere of about $1\times10^{-3}$ atm. In a vacuum atmosphere, the chamber was heated for 15 minutes at a temperature of 500° C., and compressed for 15 minutes with a load of 500 Kg. Subsequently, the resultant mold was cooled for about 30 minutes to complete manufacturing of a thermoelectric device.

Example 2

A carbon mold was filled with components sequentially, and then, the result was compression-molded to form top and bottom diffusion prevention layer powder bodies, top and bottom transition layer powder bodies, top and bottom contact layer powder bodies, and powder body for a thermoelectric material layer.

top contact layer: Fe: 0.05 g
top diffusion prevention layer: Co: 0.05 g
top transition layer: CoTe+In$_4$Se$_3$ (weight ratio=50:50): 0.05 g
thermoelectric material layer: In$_4$Se$_3$: 0.93 g
bottom transition layer: CoTe+In$_4$Se$_3$ (weight ratio=50:50): 0.05 g
bottom diffusion prevention layer: Co: 0.05 g
bottom contact layer: Fe: 0.05 g The mold containing these components was located in a vacuum hot pressing apparatus chamber, and then, air was discharged therefrom for 10 minutes to form a vacuum atmosphere of about $1\times10^{-3}$ atm. In a vacuum atmosphere, the chamber was heated for 15 minutes at a temperature of 500° C., and compressed for 15 minutes with a load of 500 Kg. Subsequently, the resultant mold was cooled for about 30 minutes to complete manufacturing of a thermoelectric device.

Example 3

A carbon mold was filled with components sequentially, and then, the result was compression-molded to form top and bottom diffusion prevention layer powder bodies, top and bottom transition layer powder bodies, top and bottom contact layer powder bodies, and powder body for a thermoelectric material layer.

top contact layer: Fe: 0.05 g
top diffusion prevention layer: CoTe+SnTe (weight ratio=50:50): 0.05 g
top transition layer: CoTe+SnTe (weight ratio=20:80): 0.05 g
thermoelectric material layer: $In_4Se_3$: 0.93 g
bottom transition layer: CoTe+SnTe (weight ratio=20:80): 0.05 g
bottom diffusion prevention layer: CoTe+SnTe (weight ratio=50:50): 0.05 g
bottom contact layer: Fe: 0.05 g The mold containing these components was located in a vacuum hot pressing apparatus chamber, and then, air was discharged therefrom for 10 minutes to form a vacuum atmosphere of about $1 \times 10^{-3}$ atm. In a vacuum atmosphere, the chamber was heated for 15 minutes at a temperature of 500° C., and compressed for 15 minutes with a load of 500 Kg. Subsequently, the resultant mold was cooled for about 30 minutes to complete manufacturing of a thermoelectric device.

Example 4

A carbon mold was filled with components sequentially, and then, the result was compression-molded to form top and bottom diffusion prevention layer powder bodies, top and bottom transition layer powder bodies, top and bottom contact layer powder bodies, and powder body for a thermoelectric material layer.

top contact layer: Fe: 0.05 g
top diffusion prevention layer: CoTe: 0.05 g
top transition layer: CoTe+$In_4Se_3$ (weight ratio=50:50): 0.05 g
thermoelectric material layer: $In_4Se_3$: 0.93 g
bottom transition layer: CoTe+$In_4Se_3$ (weight ratio=50:50): 0.05 g
bottom diffusion prevention layer: CoTe: 0.05 g
bottom contact layer: Fe: 0.05 g The mold containing these components was located in a vacuum hot pressing apparatus chamber, and then, air was discharged therefrom for 10 minutes to form a vacuum atmosphere of about $1 \times 10^{-3}$ atm. In a vacuum atmosphere, the chamber was heated for 15 minutes at a temperature of 500° C., and compressed for 15 minutes with a load of 500 Kg. Subsequently, the resultant mold was cooled for about 30 minutes to complete manufacturing of a thermoelectric device.

Example 5

A carbon mold was filled with components sequentially, and then, the result was compression-molded to form top and bottom diffusion prevention layer powder bodies, top and bottom transition layer powder bodies, top and bottom contact layer powder bodies, and powder body for a thermoelectric material layer.

top contact layer: Fe: 0.05 g
top diffusion prevention layer: Co+CoTe (weight ratio=50:50): 0.05 g
top transition layer: Co+CoTe (weight ratio=20:80): 0.05 g
thermoelectric material layer: $In_4Se_3$: 0.93 g
bottom transition layer: Co+CoTe (weight ratio=20:80): 0.05 g
bottom diffusion prevention layer: Co+CoTe (weight ratio=50:50): 0.05 g
bottom contact layer: Fe: 0.05 g The mold containing these components was located in a vacuum hot pressing apparatus chamber, and then, air was discharged therefrom for 10 minutes to form a vacuum atmosphere of about $1 \times 10^{-3}$ atm. In a vacuum atmosphere, the chamber was heated for 15 minutes at a temperature of 500° C., and compressed for 15 minutes with a load of 500 Kg. Subsequently, the resultant mold was cooled for about 30 minutes to complete manufacturing of a thermoelectric device.

Experimental Example 1

Table 1 shows components of the transition layer/diffusion prevention layer/contact layer, and amounts, interfacial resistance, and ratios thereof.

TABLE 1

| | Structure of Composite coating layer contact layer/diffusion prevention layer (weight ratio)/transition layer (weight ratio) | Interfacial resistance (mohm) | Ratio (%) |
|---|---|---|---|
| Example 1 | Fe/SnTe/SnTe + $In_4Se_3$ (50/50) | 0.191. | 0.035. |
| Example 2 | Fe/Co/CoTe + $In_4Se_3$ (50/50) | 0.196 | 0.021 |
| Example 3 | Fe/CoTe + SnTe (50/50)/CoTe + SnTe (20/80) | 0.156 | 0.011 |
| Example 4 | Fe/CoTe/CoTe + $In_4Se_3$ (50/50) | 0.535 | 0.039 |
| Example 5 | Fe/Co + CoTe(50/50)/Co + CoTe(20/80) | 0.787 | 0.038. |

Figure 6:
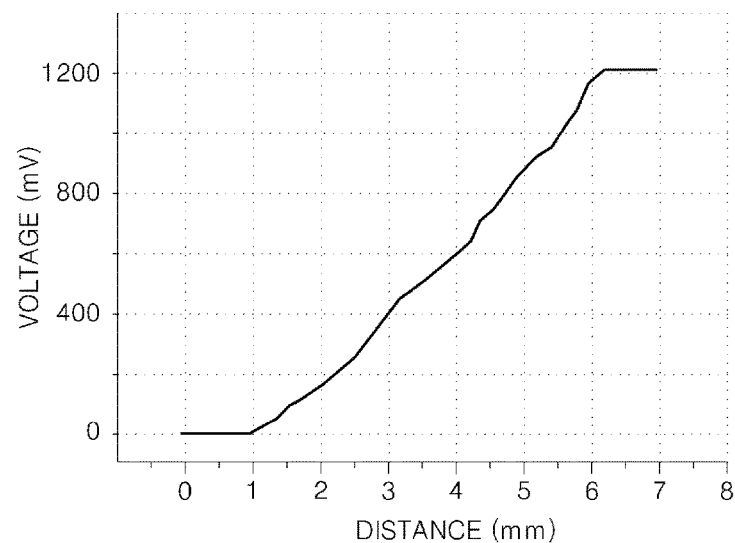
FIG. 6 is a graph of voltage (millivolts, mV) with respect to distance (millimeters, mm) of a thermoelectric device obtained according to Example 1.
Figure 7:
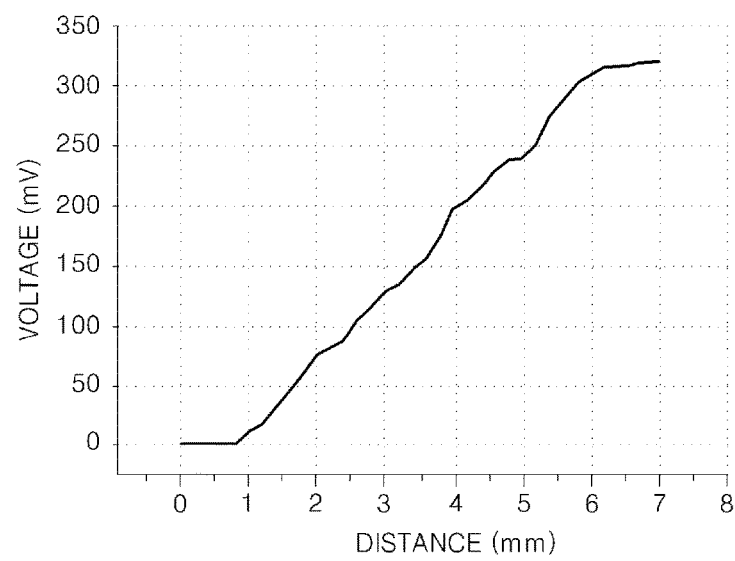
FIG. 7 is a graph of voltage (millivolts, mV) with respect to distance (millimeters, mm) of a thermoelectric device obtained according to Example 5.

FIGS. 6 and 7 are graphs of a voltage with respect to a distance of the thermoelectric devices with composition coating layers attached thereto manufactured according to Examples 1 and 5 (I was 300 mA).

As shown in Table 1, FIGS. 6 and 7, when the respective composite coating layers were applied to the layer of $In_4Se_3$ having a thickness of 7 mm, a contact resistance was as low as 0.04%. This resistance value does not affect thermoelectric performance in manufacturing a thermoelectric module. CoTe has a thermal expansion coefficient that is similar to that of $In_4Se_3$ and thus, is suitable for use in a transition layer. Also, when a mixture including $In_4Se_3$ is used in forming the transition layer, thermal stability may be further increased. Also, the CoTe material has a thermal expansion that is similar to a contact layer including Fe. When a mixed ratio is controlled, it is expected to reduce interfacial resistance and increase thermal stability.

Comparative Example 1

A carbon mold was filled with a component having the following composition, and then the component was compression-molded.

$In_4Se_3$: 0.93 g

The mold containing this component was located in a vacuum hot pressing apparatus chamber, and then, air was discharged therefrom for 10 minutes to form a vacuum atmosphere of about $1 \times 10^{-3}$ atm. In a vacuum atmosphere, the chamber was heated for 15 minutes at a temperature of 500° C., and compressed for 15 minutes with a load of 500 Kg. Subsequently, the resultant mold was cooled for about 30 minutes to complete manufacturing of a thermoelectric device.

Experimental Example 6

Figure 8:
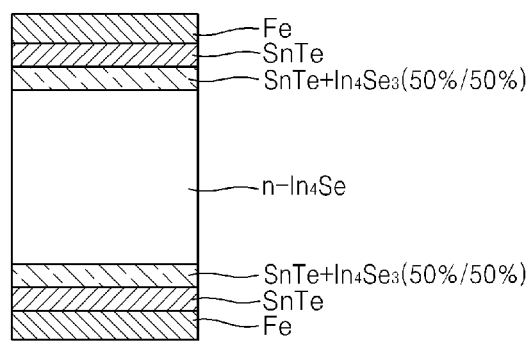
FIG. 8 is a schematic view of a thermoelectric device manufactured according to Example 1.
Figure 9:
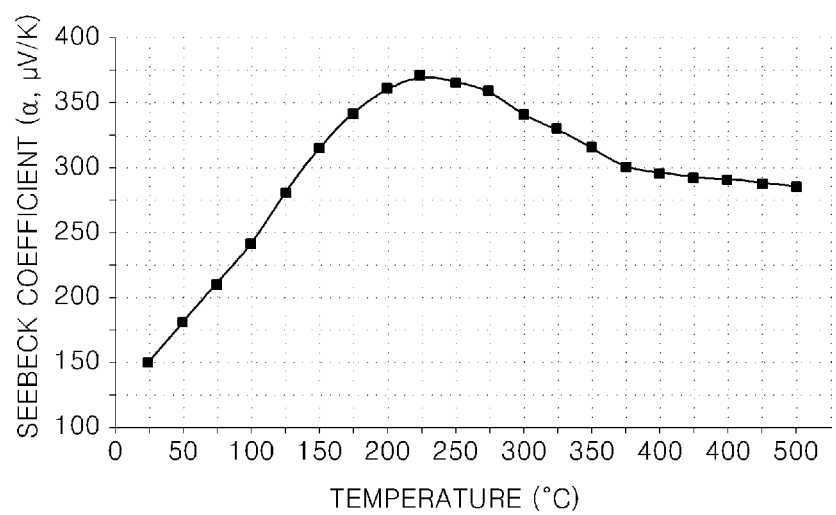
FIG. 9 is a graph of Seebeck coefficient (microvolts per Kelvin, μV/K) versus temperature (° C.) of the thermoelectric device manufactured according to Example 1.
Figure 10:
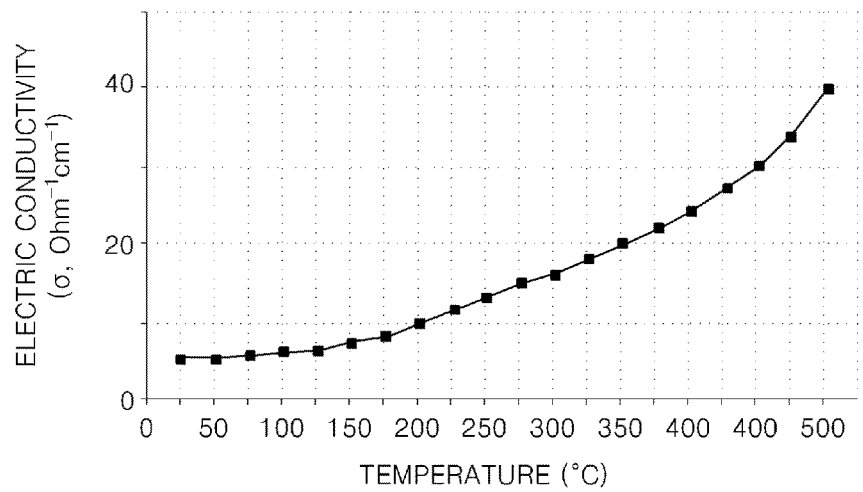
FIG. 10 is a graph of electrical conductivity (ohms$^{-1}$·centimeters$^{-1}$, ohms$^{-1}$·cm$^{-1}$) of the thermoelectric device manufactured according to Example 1.
Figure 11:
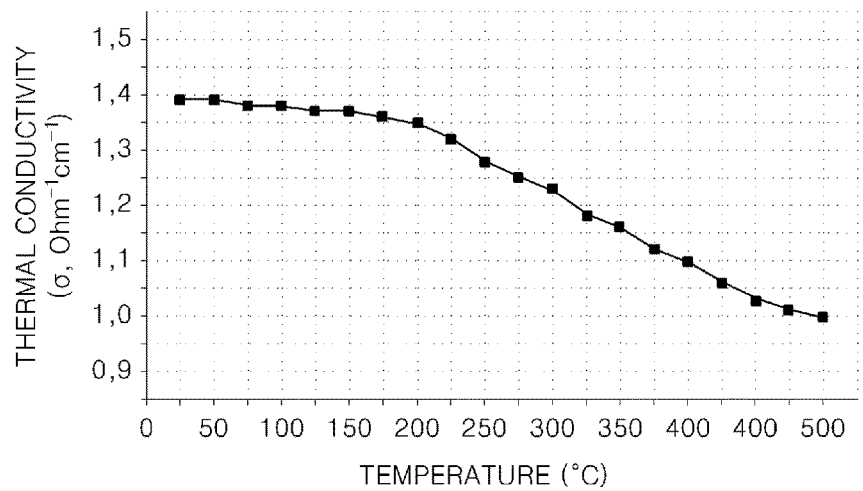
FIG. 11 is a graph of thermal conductivity (ohms$^{-1}$·cm$^{-1}$) versus temperature (° C.) of the thermoelectric device manufactured according to Example 1.
Figure 12:
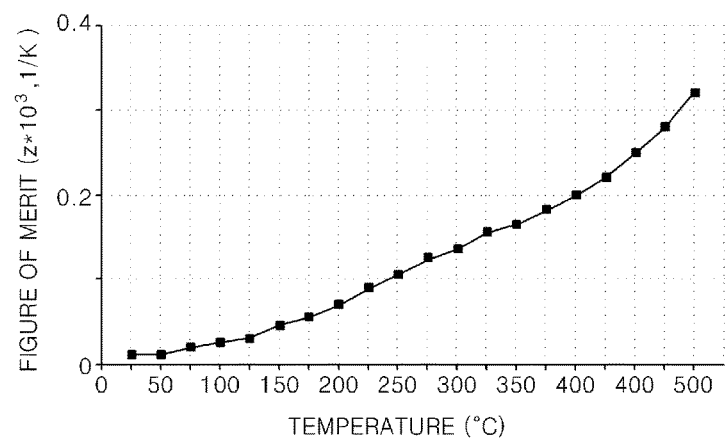
FIG. 12 is a graph of figure of merit (z*$10^3$, 1/K) versus temperature (° C.) of the thermoelectric device manufactured according to Example 1.

FIG. 8 illustrates the structure of a thermoelectric device with composite coating layers attached thereto manufactured according to Example 1. As illustrated in FIG. 8, a transition layer formed of SnTe and $In_4Se_3$ (50/50 weight ratio), a diffusion prevention layer formed of SnTe, and a contact layer formed of Fe are formed on top and bottom portions of the structure of $In_4Se_3$, which is a thermoelectric material.

Seebeck coefficient, electric conductivity, thermal conductivity, and figure of merit, which are indexes showing thermoelectric performances, of the thermoelectric device of Example 1 were measured, and the results are respectively shown in FIGS. 9, 10, 11, and 12.

Figure 13:
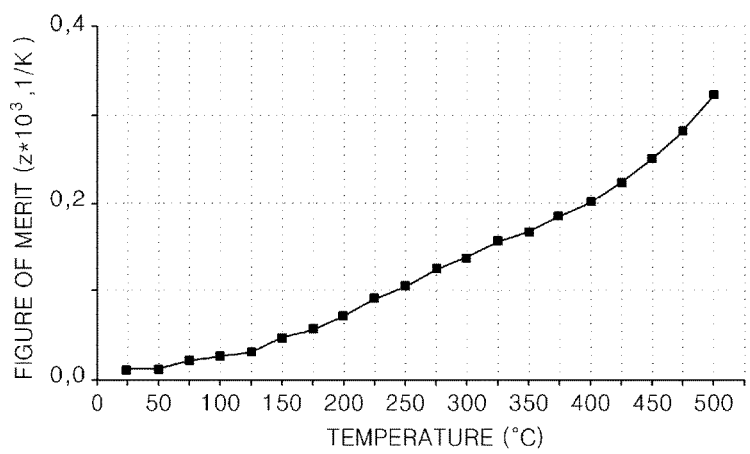
FIG. 13 is a graph of figure of merit (z*$10^3$, 1/K) versus temperature (° C.) of a thermoelectric device manufactured according to Comparative Example 1.

In addition, the figure of merit, which is an index showing a thermoelectric performance, of the thermoelectric device of Comparative Example 1 was measured, and the results are shown in FIG. 13.

Referring to FIGS. 9 to 12, it was confirmed that although the thermoelectric device of Example 1 was used together with composite coating layers were attached thereto, the thermoelectric device had excellent thermoelectric performance, and also, when compared with FIG. 13 showing results of Comparative Example 1 in which composite coating layers were not used, a decrease in performance did not occur.

Comparative Examples 2 to 5

A composite layer having the structure of transition layer (0.05 g)/diffusion prevention layer (0.05 g)/contact layer (0.05 g) shown in Table 2 was formed by vacuum deposition on top and bottom portions of a thermoelectric device prepared by plasma sintering PbTe to have a length of 7 mm

Experimental Example 2

Table 2 shows components of the transition layer/diffusion prevention layer/contact layer, and amounts, interfacial resistance, and ratios thereof.

TABLE 2

| | Structure of Composite coating layer contact layer/diffusion prevention layer (weight ratio)/transition layer (weight ratio) | Interfacial resistance (mohm) | Ratio (%) |
|---|---|---|---|
| Comparative Example 2 | Fe/SnTe/SnTe + PbTe (50/50) | 0.226 | 8.07 |
| Comparative Example 3 | Fe/Co/CoTe + PbTe (50/50) | 0.064 | 5.45 |
| Comparative Example 4 | Fe/Co + CoTe (50/50)/Co + CoTe (20/80) | 0.062 | 5.23 |
| Comparative Example 5 | Fe/Co + SnTe (50/50)/CoTe + SnTe (20/80) | 0.035. | 3.06 |

As shown in table 2, it was confirmed that when the respective composite coating layers were applied to the thermoelectric device formed of PbTe having a thickness of 7 mm, the ratio of interfacial resistance was increased.

As described above, according to the one or more of the above embodiments, due to the improvement of interfacial characteristics between an electrode and a thermoelectric device, thermal and mechanical stability are obtained, and an interfacial resistance between the electrode and the thermoelectric device may decrease, and thus, durability of a thermoelectric module is obtained and performance of the thermoelectric module is improved. Such a thermoelectric module may be used in various applications including a thermoelectric apparatus.

It should be understood that the exemplary embodiments described herein should be considered in a descriptive sense only and not for purposes of limitation. Descriptions of features, advantages, or aspects within each embodiment should be considered as available for other similar features, advantages, or aspects in other embodiments.

What is claimed is:

1. A thermoelectric device comprising:
   a thermoelectric material layer comprising a thermoelectric material;
   a diffusion prevention layer on the thermoelectric material layer, wherein the diffusion prevention layer comprises at least one of Co, Sn, Te, Ti, Pt, Pd, Ti, Si, Ta, TiW, TiN, WN, TaN, or TiWN, or a silicide of Ti, Pt, Pd, Ti, W, Ni, or Ta;
   a contact layer directly on the diffusion prevention layer, wherein the contact layer comprises at least one of Fe, Ag, or Mn; and
   a transition layer between the thermoelectric material layer and the diffusion prevention layer, wherein the transition layer comprises a material that has a thermal expansion coefficient that is similar to that of the thermoelectric material,
   wherein the transition layer comprises a combination including a compound of Formula 1 and at least one of Co, Sn, CoTe, $CoTe_2$, or SnTe,
   wherein a weight ratio of the compound of Formula 1 and at least one of Co, Sn, CoTe, $CoTe_2$, or SnTe is in a range of 1:9 to 9:1,
   wherein the thermoelectric material comprises a compound of Formula 1:

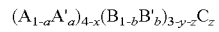

$$(A_{1-a}A'_a)_{4-x}(B_{1-b}B'_b)_{3-y-z}C_z \quad \text{Formula 1}$$

wherein A and A' are different from each other, A is In, and A' is at least one element of B, Al, Ga, In, Tl, C, Si, Ge, Sn, Pb, a rare-earth element, or a transition metal,
   wherein B and B' are different from each other, B Se, and B' is at least one element of C, Si, Ge, Sn, Pb, N, P, As, Sb, Bi, O, S, Se, Te, or Po,
   wherein C, if present, is at least one halogen atom, and
   wherein
   a complies with the inequality $0 \le a < 1$,
   b complies with the inequality $0 \le b < 1$,
   x complies with the inequality $-1 < x < 1$,
   y complies with the inequality $-1 < y < 1$, and
   z complies with the inequality $0 \le z < 0.5$.

2. The thermoelectric device of claim 1, wherein the compound of Formula 1 is a $In_4Se_{3-x}$ material.

3. The thermoelectric device of claim 1, wherein the transition layer and the diffusion prevention layer are each disposed on a top and on a bottom of the thermoelectric material layer.

4. A thermoelectric module comprising:
   an n-type thermoelectric device and a p-type thermoelectric device; and
   top and bottom electrodes to which the p-type thermoelectric device and the n-type thermoelectric device are attached so that the p-type thermoelectric device and the n-type thermoelectric device are alternately arranged,
   wherein each of the n-type thermoelectric device and the p-type thermoelectric device comprise
      a thermoelectric material layer comprising a thermoelectric material, a diffusion prevention layer, wherein the diffusion prevention layer comprises at least one of Co, Sn, Te, Ti, Pt, Pd, Ti, Si, Ta, TiW, TiN, WN, TaN, or TiWN, or a silicide of Ti, Pt, Pd, Ti, W, Ni, or Ta;

a contact layer directly on the diffusion prevention layer, wherein the contact layer comprises at least one of Fe, Ag, or Mn, and a transition layer between the thermoelectric material layer and the diffusion prevention layer, wherein the transition layer comprises a material that has a thermal expansion coefficient that is similar to that of the thermoelectric material, wherein the transition layer comprises a combination including a compound of Formula 1 and at least one of Co, Sn, CoTe, CoTe$_2$, or SnTe, wherein a weight ratio of the compound of Formula 1 and at least one of Co, Sn, CoTe, CoTe$_2$, or SnTe is in a range of 1:9 to 9:1, wherein the thermoelectric material comprises a compound of Formula 1:

$$(A_{1-a}A'_a)_{4-x}(B_{1-b}B'_b)_{3-y-z}C_z \quad \text{Formula 1}$$

wherein

A and A' are different from each other, A is In and A' is at least one element of B, Al, Ga, In, Tl, C, Si, Ge, Sn, Pb, a rare-earth element, or a transition metal, wherein B and B' are different from each other, B is Se and B' is at least one element of C, Si, Ge, Sn, Pb, N, P, As, Sb, Bi, O, S, Se, Te, or Po, wherein C, if present, is at least one halogen atom, and wherein a complies with the inequality 0≤a<1,
b complies with the inequality 0≤b<1,
x complies with the inequality −1<x<1,
y complies with the inequality −1<y<1, and
z complies with the inequality 0≤z<0.5.

5. A thermoelectric apparatus comprising the thermoelectric module of claim 4.

6. The thermoelectric apparatus of claim 5, wherein the thermoelectric apparatus is a power-generation apparatus.

7. A thermoelectric apparatus comprising:
a heat supplier; and
the thermoelectric module of claim 4.

8. A method of manufacturing the thermoelectric device of claim 1, the method comprising:
disposing a top portion of a diffusion prevention layer powder, a top portion of a transition layer powder, a thermoelectric material powder, a bottom portion of the transition layer powder, and bottom portion of the diffusion prevention layer powder sequentially and in the foregoing order in a mold;

compression-molding to form a powder body;

vacuum hot-pressing the powder body by heating and compressing the powder body in a vacuum to form a compression-molded body; and rapidly cooling the compression-molded body to manufacture the thermoelectric device, wherein the thermoelectric device comprises the diffusion prevention layer integrally attached to top and bottom portions of the thermoelectric device.

9. The method of claim 8, wherein
the vacuum hot pressing provides the thermoelectric material layer, the transition layer, and the diffusion prevention layer, which are integrally bonded.

10. A thermoelectric device comprising:
a thermoelectric material layer comprising a thermoelectric material;

a diffusion prevention layer on the thermoelectric material layer, wherein the diffusion prevention layer comprises at least one of Co, Sn, Te, Ti, Pt, Pd, Ti, Si, Ta, TiW, TiN, WN, TaN, or TiWN, or a silicide of Ti, Pt, Pd, Ti, W, Ni, or Ta;

a contact layer directly on the diffusion prevention layer, wherein the contact layer comprises at least one of Fe, Ag, or Mn; and a transition layer between the thermoelectric material layer and the diffusion prevention layer, wherein the transition layer comprises a combination including a compound of Formula 1 and at least one of Co, Sn, CoTe, CoTe$_2$, or SnTe, wherein a weight ratio of the compound of Formula 1 and at least one of Co, Sn, CoTe, CoTe$_2$, or SnTe is in a range of 1:9 to 9:1, wherein the thermoelectric material comprises a compound of Formula 1:

$$(A_{1-a}A'_a)_{4-x}(B_{1-b}B'_b)_{3-y-z}C_z \quad \text{Formula 1}$$

wherein A is In,
wherein B is Se,
and
wherein
a is equal to 0,
b is equal to 0,
x complies with the inequality −1<x<1,
y complies with the inequality −1<y<1, and
z is equal to 0.

* * * * *